United States Patent [19]

Samarov et al.

[11] Patent Number: 5,305,185

[45] Date of Patent: Apr. 19, 1994

[54] COPLANAR HEATSINK AND ELECTRONICS ASSEMBLY

[76] Inventors: Victor M. Samarov, 36 Russell St., Carlisle, Mass. 01741; Joseph A. DeCarolis, 117 West St., Lunenburg, Mass. 01462; Raoji Patel, 90 Flanagan Dr., Framingham, Mass. 01701; Gerald J. Piche, 54 Clark Rd., Milford, N.H. 03055; Glenn R. Skutt, 700 Burruss Dr., Blacksburg, Va. 24060; Steve W. Norris, 541 Gov. Chittondon Rd., Williston, Vt. 05495

[21] Appl. No.: 954,548

[22] Filed: Sep. 30, 1992

[51] Int. Cl.[5] .................................... H05K 7/20
[52] U.S. Cl. ......................... 361/704; 165/185; 174/16.3; 257/719; 257/727; 361/690
[58] Field of Search .................... 165/80.3, 185; 175/16.3; 257/726, 718–719, 727; 361/383–389

[56] References Cited

U.S. PATENT DOCUMENTS

| | | | |
|---|---|---|---|
| 3,688,159 | 8/1972 | Robbins | 361/386 |
| 4,321,423 | 3/1982 | Johnson et al. | 361/388 |
| 4,517,624 | 3/1985 | Wessely | 361/387 |
| 4,521,829 | 6/1985 | Wessely | 361/386 |
| 4,561,011 | 12/1985 | Kohara et al. | 361/386 |
| 4,654,754 | 3/1987 | Daszkowski | 174/16.3 |
| 4,658,331 | 4/1987 | Berg | 361/387 |
| 4,689,720 | 8/1987 | Daszkowski | 174/16.3 |
| 4,979,074 | 12/1990 | Morley et al. | 361/387 |
| 5,065,280 | 11/1991 | Karnezos et al. | 361/387 |

FOREIGN PATENT DOCUMENTS 3250697 11/1991 Japan ......................... 361/386

OTHER PUBLICATIONS

Darrow et al "Stack Structure for Mixed Technology Thermal Enhancement", IBM Tech Disc. Bulletin, vol. 22, No. 3, Aug. 1979, p. 958.

*Primary Examiner*—Gregory D. Thompson
*Attorney, Agent, or Firm*—Albert P. Cefalo; Ronald C. Hudgens; Barry Young

[57] ABSTRACT

There is provided a method and materials for cooling the power train components, such as transformers, rectifiers, chokes, and the like, of an integrated on-board power supply IOP) using a single heatsink. Spacers are positioned between the power train components and a substrate, the substrate for mounting the components. The spacers are individually dimensioned and shaped to raise the heat-removal surfaces of the components to a substantially uniform and minimal height. A heatsink having a substantially planar, heat-acquiring surface is positioned on the heat-removal surfaces of the power train components. Fasteners are used to compress the spacers, urging the components against the heatsink to provide a substantially continuous and coplanar thermal interface between the components and the heatsink. After the components, heat sink and substrate have been fastened to each other, the components are electrically connected to the substrate by soldering.

4 Claims, 4 Drawing Sheets

COPLANAR HEATSINK AND ELECTRONICS ASSEMBLY

FIELD OF THE INVENTION

This invention relates to the cooling of heat generating temperature-sensitive electronic components, more particularly to a system to provide a heatsink and electronics assembly with a coplanar heat transfer interface.

BACKGROUND OF THE INVENTION

A very significant limitation on the operation and reliability of electronic components is the efficient extraction of heat. Unless heat generating components are provided with an efficient heat transfer mechanism to maintain them within a predetermined operating temperature range, the power and useful life of the components are severely limited. Excessive over-heating of electronic components may cause their destruction.

The problem of heat removal is increased for power supply modules having components of different heights, and which are densely populated on a substrate. Particularly, with integrated on-board power supplies (IOPs), such as DC-to-DC converters the problem of heat removal is acute, since power supplies generate a substantial amount of heat. An IOP is a module which is self-contained and typically mounted on a circuit board containing the logic components of the computer system. In order to minimize the total size of the system, the spacing or pitch between the various circuit boards of the computer system which are inserted in parallel fashion in the back plane of the computer system is kept to a minimum. Therefore, the height or profile of the IOP, including the heat generating components is kept, for example, less than 0.3 inches, and the height of the IOP including the heat dissipating components, such as a heatsink, must be kept less than the inter-board spacing.

A typical IOP includes heat generating power train components, for example, transformers, field effect transistors (FETs), rectifiers, and chokes. In general, the power train components are of varying surface topologies and of different heights. The components are provided with leads to permit attachment to a substrate. The leads are inserted in plated through holes or vias and electrically connected by solder to conductive circuit traces formed on the substrate.

It is a common approach in the cooling of heat generating components having different heights to provide the components, with poli-directional, or mono-directional heatsinks. Typically, the heatsinks are individually attached to the tops of the components for the purpose of dissipating heat. The drawbacks of such an approach is that the individual heatsinks are of necessity limited in their footprints, must each be sized to conform to the geometry of the components being cooled, must be aligned carefully with the components and are otherwise limited by the overall size of the system into which the module is incorporated. It is tedious and expensive to adapt individually heatsinks to discrete heat generating components 11–14 which are diverse in placement, shape, and height.

Alternatively, the power train components of the IOP are cooled by a single heatsink which is placed in thermal contact with the opposite side of the substrate on which the components are located. Although this scheme is fairly simple to assemble, it is less efficient in drawing heat from the components through the substrate, particularly if the components are surface mounted and lack leads protruding through the substrate for conducting heat, or if the substrate is made of relatively inexpensive material, for example, epoxy-glass, which has poor thermal conduction characteristics. Moreover, because the IOP is usually mounted on a circuit board, an undesirable cut-out may be required in the circuit board to accommodate the heatsink. Furthermore, some power train components generate so much heat that direct thermal contact with a heatsink is required to maintain the components at a desirable temperature.

Another approach is to provide a single heatsink for the group of components. The main drawback of this approach is that it is a complex task to thermally mate the rigid heatsinks with the components. Generally, a thermally conductive epoxy is used to cover the components in order to create a relatively smooth surface to mate with the heatsink. Thermally conductive epoxies require special handling, long curing time, and generally increase the manufacturing cost of the module. Also, the thermal conductivity of epoxies is relatively poor, typically about 10% than that of metals, requiring that the module be operated at substantially reduced power.

Alternatively, the mating surface of the single heatsink is especially machined to conform to the external mating surfaces of the components. This approach requires additional labor and careful alignment of the heatsink and components during assembly.

Accordingly, the known solutions for cooling an IOP increase the cost of assembly, and do not always provide for effective cooling of discrete and variously shaped heat generating components.

Therefore, it is desirable to provide an apparatus and method for reliably cooling an integrated on-board power supply which is simple to assemble, uses readily available inexpensive materials, and is easily adaptable to mass production methods at reduced costs.

SUMMARY OF THE INVENTION

In accordance with the invention, there is provided a system, that is a method and materials, to provide an electronics assembly and a heatsink with a coplanar heat transfer interface. The electronics assembly includes power train components, such as transformers, rectifiers, chokes, and the like, having different heights positioned on a substrate. The components are cooled by a single heatsink in heat transfer relationship with heat-removal surfaces of the components.

In one embodiment of the invention, spacers are placed between the power train components and the substrate. The spacers are individually dimensioned and shaped so as to raise the heat-removal surfaces of the components to a substantially uniform and minimal height. A heatsink having a substantially planar heat-acquiring surface is positioned on the coplanar heat-removal surfaces of the power train components. The spacers also improve the fit between the heat-removal surfaces of the components and the heat-acquiring surface of the heatsink. Fastening means are used to compress the spacers, urging the components against the heatsink to provide a substantially continuous and coplanar thermal interface. After the components, heat sink and substrate have been fastened to each other, the components are electrically connected to the substrate by soldering.

BRIEF DESCRIPTION OF THE DRAWINGS

These and other features and advantages of the present invention will become apparent from a reading of the detailed description in conjunction with the attached drawings in which like reference numerals refer to like elements in the several views.

DETAILED DESCRIPTION OF THE PREFERRED EMBODIMENT

Figure 1:
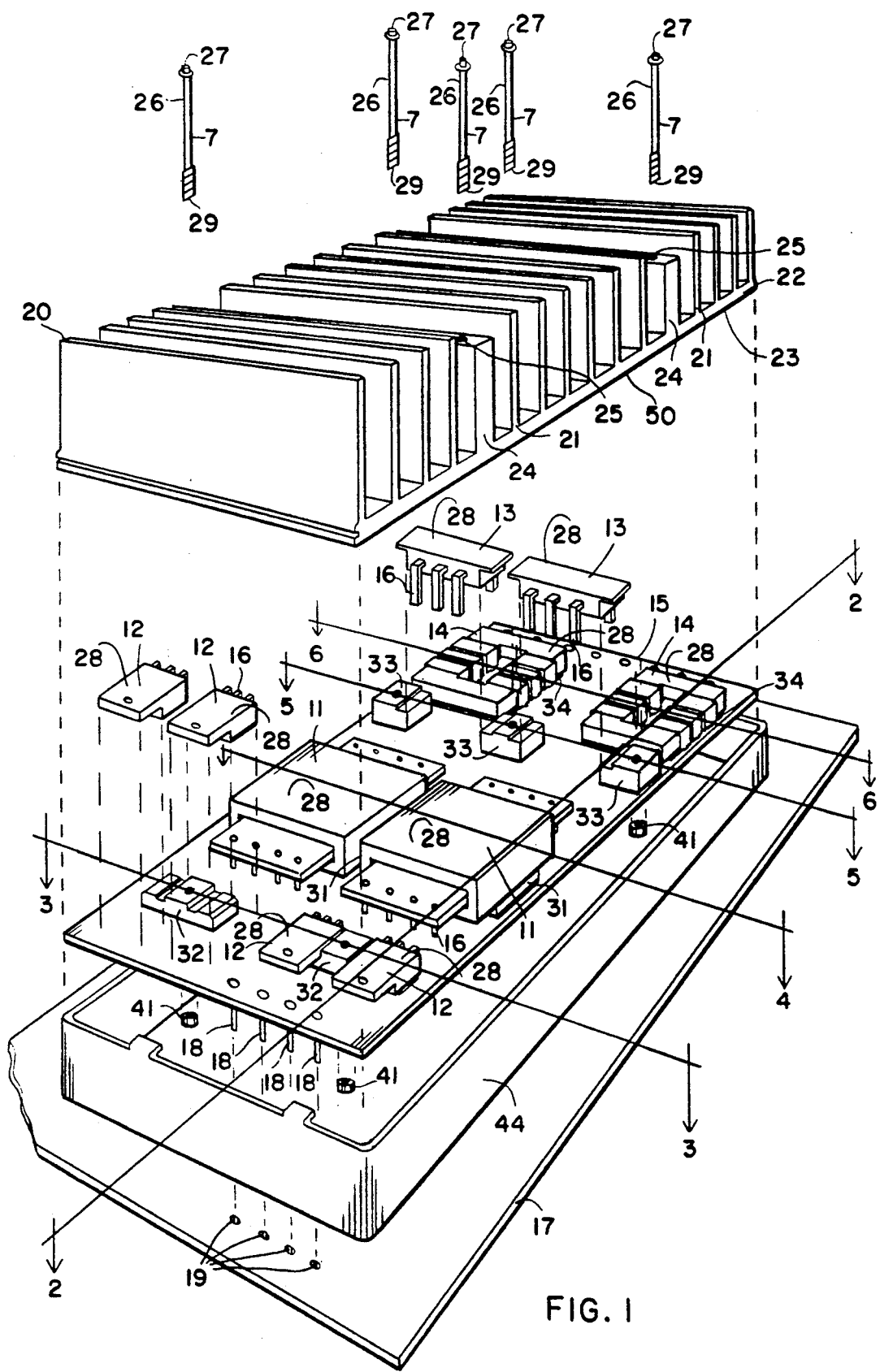
FIG. 1 is an exploded perspective view of an integrated on-board power supply (IOP) according to the principles of the present invention.

FIG. 1 shows an exploded view of an integrated on-board power supply (IOP) 1, for example, a DC-to-DC converter, for powering the logic components of a computer system. The IOP 1 includes a plurality of heat generating components, for example, transformers 11, field effect transistors (FETs) 12, rectifiers 13, and chokes 14. The IOP 1 usually also includes other components such as resistors, capacitors, diodes, and the like, not shown. The components 11-14, generally known as the "power train" components, are connected to conductive traces, not shown, etched on, or in a planar substrate 15 by means of leads, generally indicated by reference numeral 16. The leads 16 are typically inserted in vias 16a, not shown in FIG. 1, but visible in FIG. 2. Each of the components 11-14 have heat-removal surfaces 28 on one side thereof.

Typically, the IOP 1 is mounted on a circuit board 17, and pins 18 are used to electrically connect the circuits of the IOP 1 with the circuits of the printed circuit board 17. The pins 18 are, for example, inserted in plated through holes 19 of the printed circuit board 17. The printed circuit board 17 typically carries the logic components, not shown, of the computer system, the logic components powered by the IOP 1.

The operation of the IOP 1 produces heat which must be removed to prevent the failure or destruction of the components 11-14. To overcome the drawbacks of the prior art, a heatsink 20 is positioned substantially parallel to the substrate 15. The heatsink 20 includes a plurality of fins, generally indicated by reference numerals 21 and 24, positioned on a mounting base of the heatsink 20. One side of the heatsink 20 is a substantially planar, heat-acquiring surface 23. The heat-acquiring surface 23 is placed in thermal contact with the heat-removal surfaces 28 of the components 11-14.

Some of the fins, for example, fins 24 are made wider than fins 21. The wider fins 24 include screw holes 25 extending therethrough for receiving screws 26. The fins 24 are made shorter than the fins 21 so that the heads 27 of the screws 26, when inserted in the screw holes 25, do not protrude above the top plane of the heatsink 20. The screws 26 are made long enough so that the ends 29 protrude through the circuit board 17 when positioned in place.

Typically, the heatsink 20 is made of, for example, extruded aluminum. It is difficult, without additional machining, to make the heat-acquiring surface 23 completely flat. Deviations from flatness of the heat-acquiring surface 23 may be in the range of $-/+$ 0.005 inches. Therefore, any misalignment between the heat-removal surfaces 28 of the components 11-14 and the heat-acquiring surface 23 of the heatsink 20 will produce air gaps which interfere with the transfer of heat from the components 11-14 to the heatsink 20.

In order to assure coplanarity of each of the heat-removal surfaces 28 of the components 11-14 with the adjoining heat-acquiring surface 23 of the heatsink 20, spacers 31-34 are placed between the substrate 15 and the components 11-14. The spacers 31-34 serve to raise the top heat removal-surfaces 28 of the components 11-14 to a uniform and minimal height, for example, approximately 0.300 inches, and also to improve the fit of the thermal mating surfaces 23 and 28.

In the embodiment shown, the IOP 1 includes transformer spacers 31, FET spacers 32, rectifier spacers 33 and choke spacers 34. The spacers 31-34 are sized so that the combined heights of the spacers 31-34 and the respective components 11-14 are approximately equal. For example, the transformer spacers 31 and the choke spacers 34 are relatively thin when compared with the FET spacers 32 and the rectifier spacers 33. The transformer spacers 31 and the choke spacers 34 are made as, for example, a thin compressible foam rubber pad having a width and length of approximately 0.250 inches, and a compressed thickness of 0.010 inches. The FET spacers 32 and the rectifier spacers 33 are made of, for example, a high strength plastic, such as "ULTEM" made by the General Electric Company, Pittsfield, Mass. The spacers 31-34 are individually dimensioned and configured, as will be explained herein, for the respective components 11-14.

The IOP 1 further includes fastening means, for example, self-clinching threaded inserts 41. Suitable inserts 41 are model KFSE 4.40 "PEM" nuts made by the Penn Engineering Manufacturing Corp., Danboro, Pa. The inserts 41 are positioned in insert through holes 42, not shown in FIG. 1, but visible in FIGS. 2-6, formed in the substrate 15. The inserts 41 are vertically aligned with the screw holes 25 to permit the insertion of the screws 26. The IOP 1 is also equipped with a metallic skirt 44 positioned between the heatsink 20 and the circuit board 17 to provide the IOP 1 with electromagnetic shielding.

And, in the preferred embodiment, the heat-acquiring surface 23 of the heatsink 20 is further provided with an electrically insulating, thermally conductive sheet, generally indicated by reference numeral 50 in the drawings. A suitable material for the insulating sheet 50 is a self-adhesive plastic film or self-adhesive paper. The sheet 50 is pre-cut to size, including holes for the screws 26. The sheet 50 is made relatively thin, for example, in the range of 0.003 to 0.005 inches.

Figure 2:
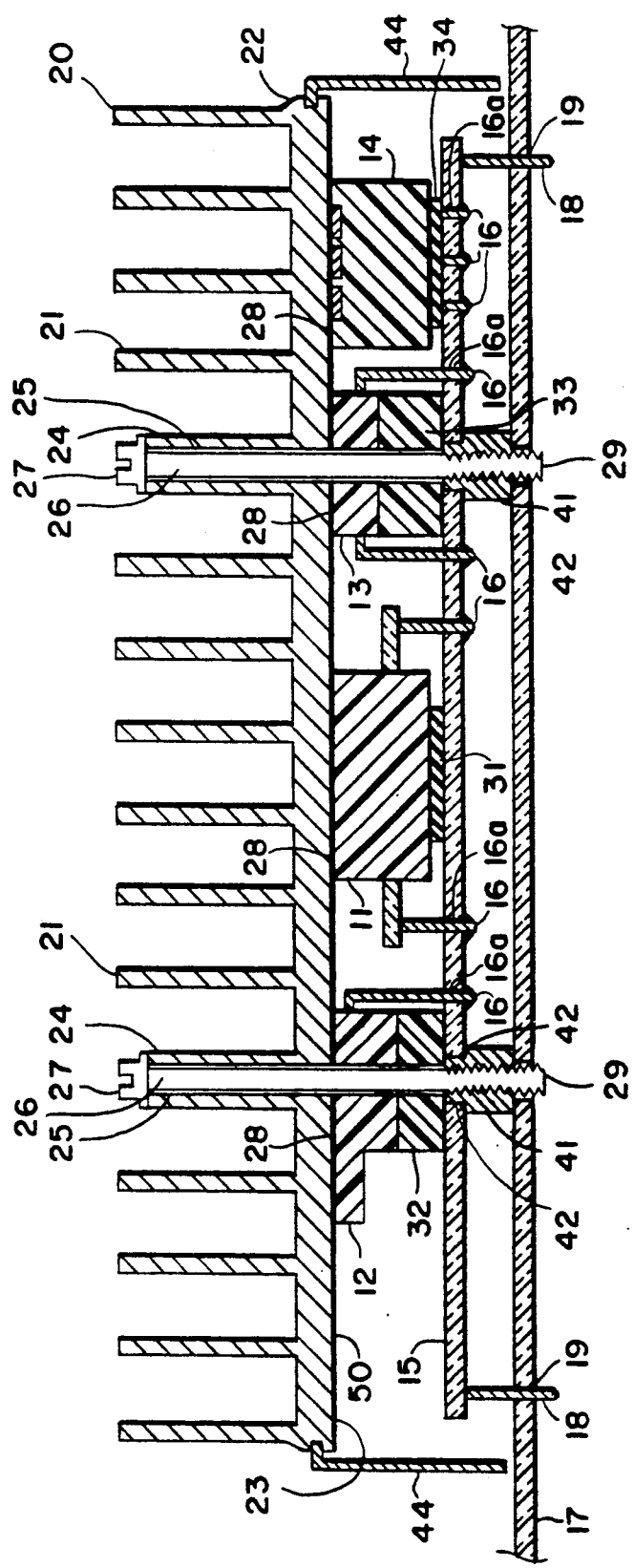
FIG. 2 is a cross-section of the IOP, assembled, of FIG. 1 approximately along line 2—2.

FIG. 2 is a cross sectional view of the IOP 1, assembled, taken approximately along line 2—2 of FIG. 1 to show further details not readily visible in FIG. 1. The FET spacer 32 and the rectifier spacer 33 are additionally equipped with tabs 22 to facilitate the positioning of the spacers 32 and 33 during assembly. The distance from the top surface of the substrate 15 to the heat-acquiring surface 23 of the heatsink 20 is about 0.300 inches.

Figure 3:
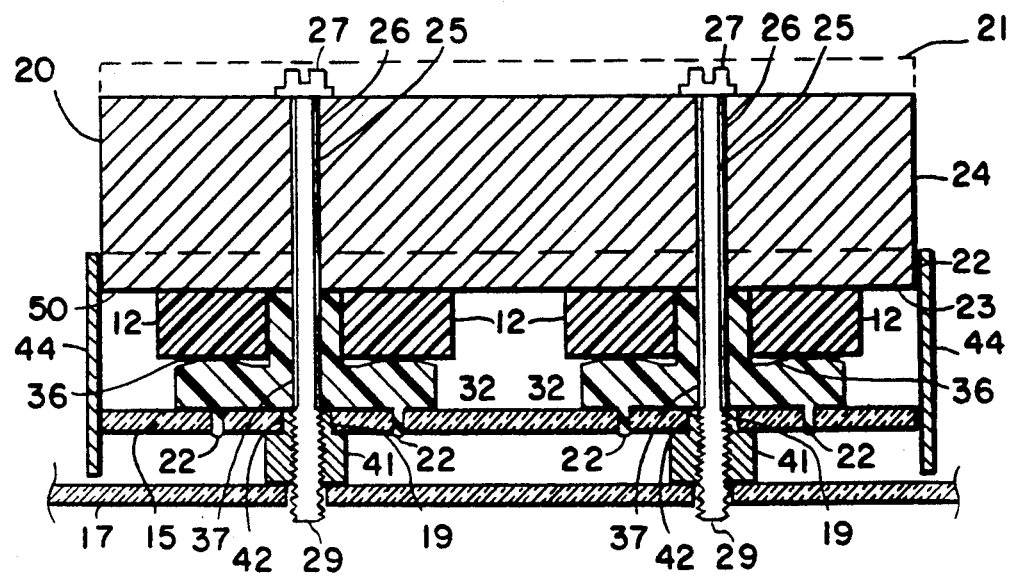
FIG. 3 is a cross-section of the IOP, assembled, of FIG. 1 approximately along line 3—3.

FIG. 3 is a cross sectional view of the IOP 1 showing the FETs 12, and the FET spacers 32. The FET spacers 32 are approximately shaped as an inverted "T". The support surface 36 of the FET spacers 32 are beveled to facilitate thermal mating of the heat-removal surface 28 of the FETs 12 with the heat-acquiring surface 23 of the heatsink 20. That is, the FETs 12 can adjust their orientation to compensate for any local deviations from flatness in the heat-acquiring surface 23. The center of each of the FET spacers 32 include a spacer hole 37 for receiving the screws 26. Each FET spacer 32 is configured and dimensioned to support two FETs 12.

Figure 4:
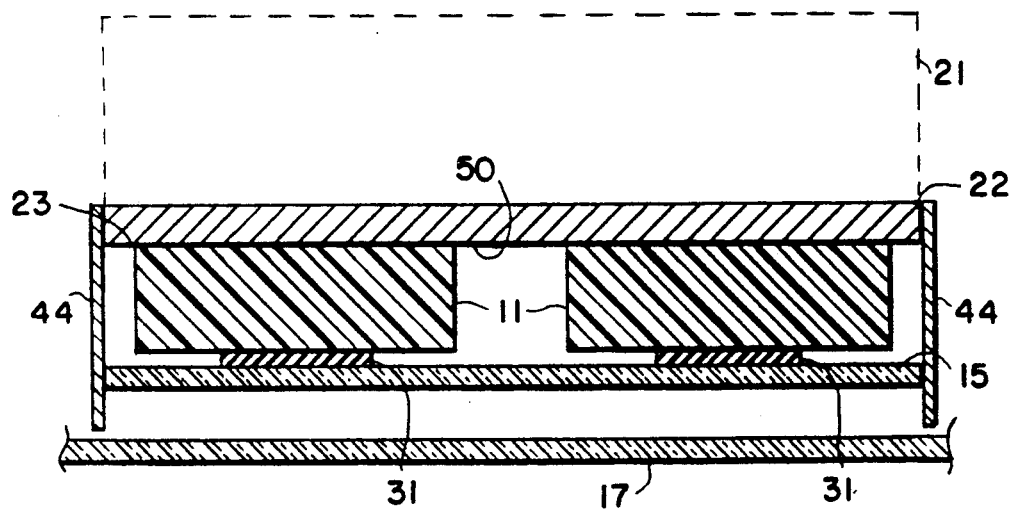
FIG. 4 is a cross-section of the IOP, assembled, of FIG. 1 approximately along line 4—4.

FIG. 4 is a cross sectional view of the IOP 1 showing the transformers 11, and the transformer spacers 31. Since the transformers 11 are slightly less than the desirable height of 0.300 inches, the transformer spacers 31 are made relatively thin and of a compressible material.

Figure 5:
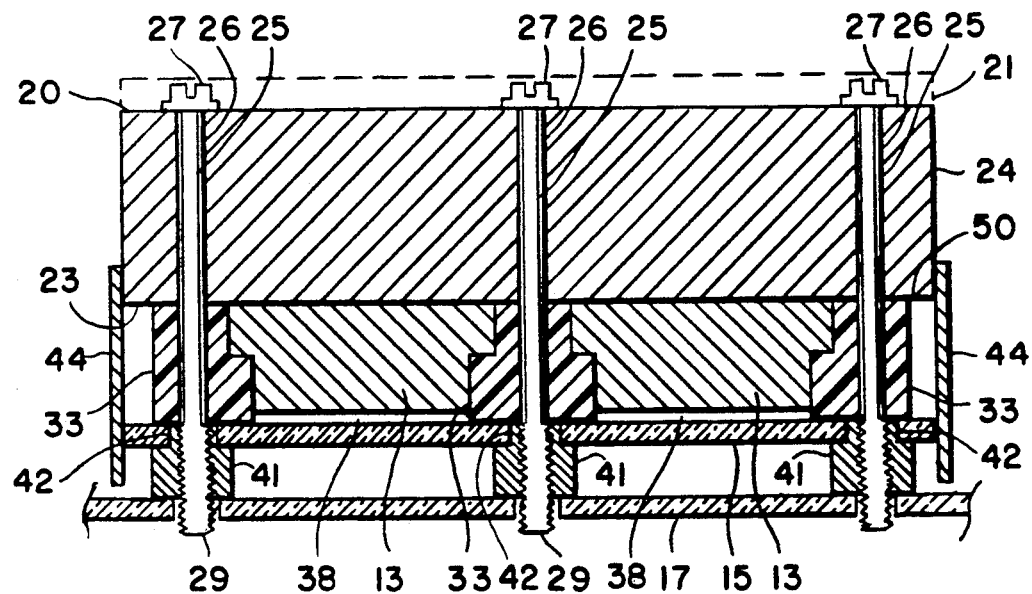
FIG. 5 is a cross-section of the IOP, assembled, of FIG. 1 approximately along line 5—5.

FIG. 5 is a cross sectional view of the IOP 1 showing the rectifiers 13, and the rectifier spacers 33. In the preferred embodiment three rectifier spacers 33 are used to support two rectifiers 12. The two end rectifier spacers 33 are "L"-shaped, and the middle rectifier spacer 33 is in the form of an inverted "T". The height of the rectifier spacers 33 is made slightly larger than the height of the rectifiers 33 so that a small clearance is provided under the rectifiers 33 in the area generally indicated by reference numeral 38.

Figure 6:
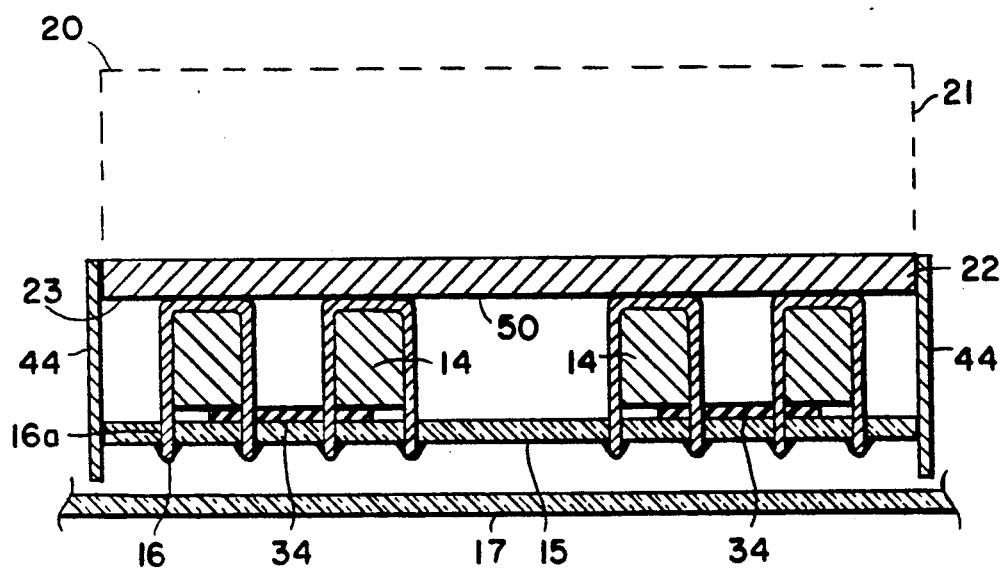
FIG. 6 is a cross-section of the IOP of FIG. 1 assembled approximately along line 6—6.

FIG. 6 is a cross sectional view of the IOP 1 showing the chokes 14, and the choke spacers 34. The choke spacers 34, like the transformers 11, are slightly less than the desirable height of 0.300 inches, and therefore, the choke spacers 34 are made relatively thin and of a compressible material.

Now with reference to FIG. 1-6, the assembling of the IOP 1 and the heatsink 20 is described in further detail. The electrically insulating sheet 50 is adhesively secured to the heat-acquiring surface 23 of the heatsink 20. The inserts 41 are positioned in the insert through holes 42 of the substrate 15. The electrical component of the IOP 1, except for the power train components 11-14, for example, transistors, diodes, capacitor, resistors, and the like (not shown), are connected to the substrate 15 by using a relatively high-temperature solder, e.g., in a reflow chamber.

In order to compensate for any variation in the flatness tolerance of the surface 23 of the heatsink 20, and the height and coplanarity of the heat-removal surfaces 28 of the components 11-14, the components 11-14 are positioned on the spacers 31-34, respectively, and the leads 16 of the components 11-14 are inserted in the plated through holes 16a in a loose manner to allow the components 11-14 to move in a direction perpendicular to the substrate 15.

The heatsink 20 is placed on the heat-removal surfaces 28 of the components 11-14, and the screws 26 are inserted in the screw holes 25 to engage with the inserts 41. The screws 26 are tightened, urging each of the components 11-14 independently towards the heat-acquiring surface 23 of the heatsink 20 by the elastic force created by compressing the spacers 31-34, while the leads 16 are free to move in the plated through holes 16a until the heat-removal surfaces 28 of the components 11-14 are thermally mated with the heat-acquiring surface 23 of the heatsink 20.

The leads 16 are attached to the substrate 15 by, for example, passing the assembly through a wave soldering machine, using a relatively lower temperature solder. The pins 18 are attached to the circuit board 17, and the shielding skirt 44 is positioned around the periphery of the heatsink 20 and the IOP 1.

Because the tightening of the screws 26 takes place before the power train components 11-14 are fixed in place by soldering, the heat-removal surfaces 28 of the components 11-14 are relatively free to move to assume a fully coplanar position with the heat-acquiring surfaces of the heatsink 20.

Although the above description has proceeded with reference to a cooling system for an integrated on-board power supply, it is to be understood that the system as is disclosed herein may be adapted to a wide variety of heat generating electronic modules where there is a need to provide cooling for heat generating components presenting an irregular surface profile.

Therefore the invention is not necessarily limited to the particular embodiment shown herein. It is to be understood that various other adaptations and modifications may be made within the spirit and scope of the claims.

What is claimed is:

1. An apparatus, for providing a coplanar heatsink and electronics assembly, comprising:
    a substantially planar substrate;
    heat generating components of different heights positioned on one side of said substrate, each of said components including a heat-removal surface on one side thereof;
    at least one spacer positioned between said heat generating components and said substrate, each of said spacers dimensioned in relation to the height of its associated heat generating component such that said heat removal surfaces of said heat generating components are substantially coplanar with one another;
    a heatsink having a substantially planar heat-acquiring surface on one side thereof, said heat-acquiring surface positioned on said heat-removal surfaces of said components; and
    means for fastening said heatsink to said substrate to compress said spacers, thereby urging said heat-removal surfaces against said heat acquiring surfaces.

2. The apparatus as in claim 1 wherein said means for fastening includes a plurality of self-clinching threaded inserts positioned in said substrate, and a plurality of screws, said screws inserted through said heatsink to engage with said inserts.

3. The apparatus as in claim 1 wherein said heatsink is made of extruded aluminum.

4. The apparatus as in claim 1 further including means for electrically connecting said heat generating components to said substrate.

UNITED STATES PATENT AND TRADEMARK OFFICE
CERTIFICATE OF CORRECTION

PATENT NO. : 5,305,185
DATED : April 19, 1994
INVENTOR(S) : Samarov et al

It is certified that error appears in the above-indentified patent and that said Letters Patent is hereby corrected as shown below:

On the title page, after item [76] Inventors: insert the following:

--[73] Assignee: Digital Equipment Corporation, Maynard, MA--.

Signed and Sealed this

Twentieth Day of September, 1994

Attest:

BRUCE LEHMAN

Attesting Officer     Commissioner of Patents and Trademarks